United States Patent [19]
Elliott

[11] Patent Number: 4,896,397
[45] Date of Patent: Jan. 30, 1990

[54] PRINTED CIRCUIT BOARD HANDLING DEVICE

[75] Inventor: Kenneth F. Elliott, Ferring, England

[73] Assignee: U.S. Philips Corporation, New York, N.Y.

[21] Appl. No.: 355,125

[22] Filed: May 19, 1989

[30] Foreign Application Priority Data

Jun. 9, 1987 [GB] United Kingdom ............... 8713459

[51] Int. Cl.⁴ .............................................. B25G 3/38
[52] U.S. Cl. .................................... 16/114 R; 439/296
[58] Field of Search ............. 16/112, 114 R; 439/296, 439/312

[56] References Cited

U.S. PATENT DOCUMENTS

| | | | |
|---|---|---|---|
| 312,766 | 2/1885 | Schott | 16/296 |
| 2,702,651 | 2/1955 | Graham | 16/293 X |
| 3,345,681 | 10/1967 | Pletscher | 16/291 |
| 4,261,076 | 4/1981 | Clemens | 16/112 |
| 4,530,615 | 7/1985 | Katsuura et al. | 16/112 X |
| 4,638,405 | 1/1987 | Smith | 439/296 X |
| 4,697,303 | 10/1987 | Matsui et al. | 16/112 |

FOREIGN PATENT DOCUMENTS 29484 6/1981 European Pat. Off. .

OTHER PUBLICATIONS

IBM Technical Disclosure Bulletin, vol. 27, No. 6, Nov. 1984, pp. 3536-3538.

Primary Examiner—Richard K. Seidel
Assistant Examiner—Carmine Cuda

[57] ABSTRACT

A handle (10) attached to a printed circuit board (7) for manually inserting and removing the board into and from a rack has a pivotable lever (13,14) at each end of an elongate member (11); to disengage a multi-pin plug and socket connector (8,9) when it is desired to remove the board from the rack, the levers (13,14) are rotated to engage cross-bar members (1,2) of the rack, exerting moments on the handle (10) tending to withdraw the board from the rack. To inhibit rattling of the levers (13,14), when the rack is subjected to vibration, and other undesired rotation of the levers, recesses (25,26) are provided in the elongate member (11) respectively adjacent the levers, the recesses receiving respective resiliently deformable elements (27,28), such as cylinders of neoprene rubber, which co-operate with the levers to urge them towards their inoperative positions.

8 Claims, 2 Drawing Sheets

PRINTED CIRCUIT BOARD HANDLING DEVICE

DESCRIPTION

This is a continuation of application Ser. No. 200,089, filed May 27, 1988 now abandoned.

The invention relates to a handling device (sometimes referred to herein as a handle) suitable for manually inserting and removing a printed circuit board into and from a rack. The handle comprises a rigid elongate member adapted to be attached to a printed circuit board at one end thereof substantially in the plane of the board, and further comprising two ejector levers pivotably attached to the elongate member respectively one at each end thereof, each lever being manually rotatable in the plane of the board about a respective pivot from an inoperative position to an operative position in which, when the board is mounted in the rack, the lever engages the rack for exerting a moment on the handle tending to withdraw the board from the rack.

With electrical or electronic equipment comprising a number of printed circuit boards housed in a rack, it is convenient to provide each board with such a handling device whereby the board can readily be inserted into and removed from the rack if, for example, it is necessary to replace the board. The board is inserted into the rack by manually gripping the elongate member and offering the board up to the rack so that two opposite longitudinal edges of the board extending away from the handling device are received in slotted guide means in the rack. The board typically carries at least one multi-pin connecting plug at its longitudinal end remote from the handling device. As the board is slid along the slotted guide means, this plug engages with a corresponding socket mounted in the rack. When it is desired to remove the board from the rack, it is necessary to apply a substantial force to disengage the plug from the socket. It is awkward to apply sufficient force purely by gripping the elongate member of the handling device. The two ejector levers are provided respectively at opposite ends of the elongate member each to engage a respective cross-bar member of the rack. These cross-bar members extend normally to the plane of the board, adjacent the location of the handling device when the board is mounted in the rack, the separation of the cross-bar members being slightly greater than the width of the board. When the board is mounted in the rack, the ejector levers can be rotated to a small extent from their inoperative positions before they engage the cross-bar members: this play is provided so as to ensure that the ejector levers do not interfere with complete engagement of the plug and socket connector. To withdraw the board from the rack, the two ejector levers are simultaneously manually rotated so as to engage the respective cross-bar members, thereby each applying a moment to the handling device that tends to withdraw the board from the rack. When the plug and socket connector has disengaged, the elongate member may be gripped manually (instead of the levers) and the board pulled out.

When a rack housing a substantial number of boards is used in conditions in which it is subjected to mechanical shock or vibration, a substantial amount of noise may be produced, in view of the above-mentioned play in the ejector levers when a board is mounted in a rack, as the levers swing backwards and forwards and hit the limits of their play. Furthermore, when a set of boards is mounted in a portion of a rack that can itself be slid into and out of a larger housing, rotation of a handling device away from its inoperative position can interfere with the sliding of the rack portion.

It is an object of the invention to alleviate the above-mentioned problems.

According to the invention, there is provided a handle suitable for manually inserting and removing a printed circuit board into and from a rack, the handle comprising a rigid elongate member adapted to be attached to a printed circuit board at one end thereof substantially in the plane of the board, and further comprising two ejector levers pivotably attached to the elongate member respectively one at each end thereof, each lever being manually rotatable in the plane of the board about a respective pivot from an inoperative position to an operative position in which, when the board is mounted in the rack, the lever engages the rack for exerting a moment on the handle tending to withdraw the board from the rack, wherein the handle comprises two resiliently deformable elements each received in a respective recess and each adapted to urge a respective one of the levers towards said inoperative position.

Preferably, the recesses are in the elongate member respectively adjacent the levers, the deformable element received in each recess being co-operable with the respective adjacent lever to urge the lever towards said inoperative position. Such a handle may be simpler to manufacture than one in which the recesses are in the levers.

Suitably, each lever has a surface with a plurality of portions successively respectively engageable with the respective deformable element as the lever is rotated, said plurality comprising first and second portions which are respectively relatively further from and closer to the pivot of the lever and which are so disposed that when the deformable element engages the first portion, it urges the lever towards said inoperative position. Said surface may be substantially planar, which is particularly simple to design and manufacture.

Said plurality may comprise a third portion which is further from the pivot than the second portion and which is on the side of the second portion remote from the first portion, whereby when the deformable element engages the third portion, it urges the lever towards said operative position. This may be convenient for handling of the board during removal of the board from the rack and, when the elongate member includes a broad slot for receiving a strip bearing an identifying legend for the board, for gaining uninterrupted access to the slot to insert or remove such a strip.

A particularly simple and durable deformable element is a cylindrical element of resiliently deformable material, the cylindrical surface of which element engages said surface of the lever.

An embodiment of the invention will now be described, by way of example, with reference to the accompanying diagrammatic drawings, in which FIG. 1 is a schematic perspective view of a portion of a rack in which is mounted a printed circuit board fitted with a handle embodying the invention;

Figure 1:
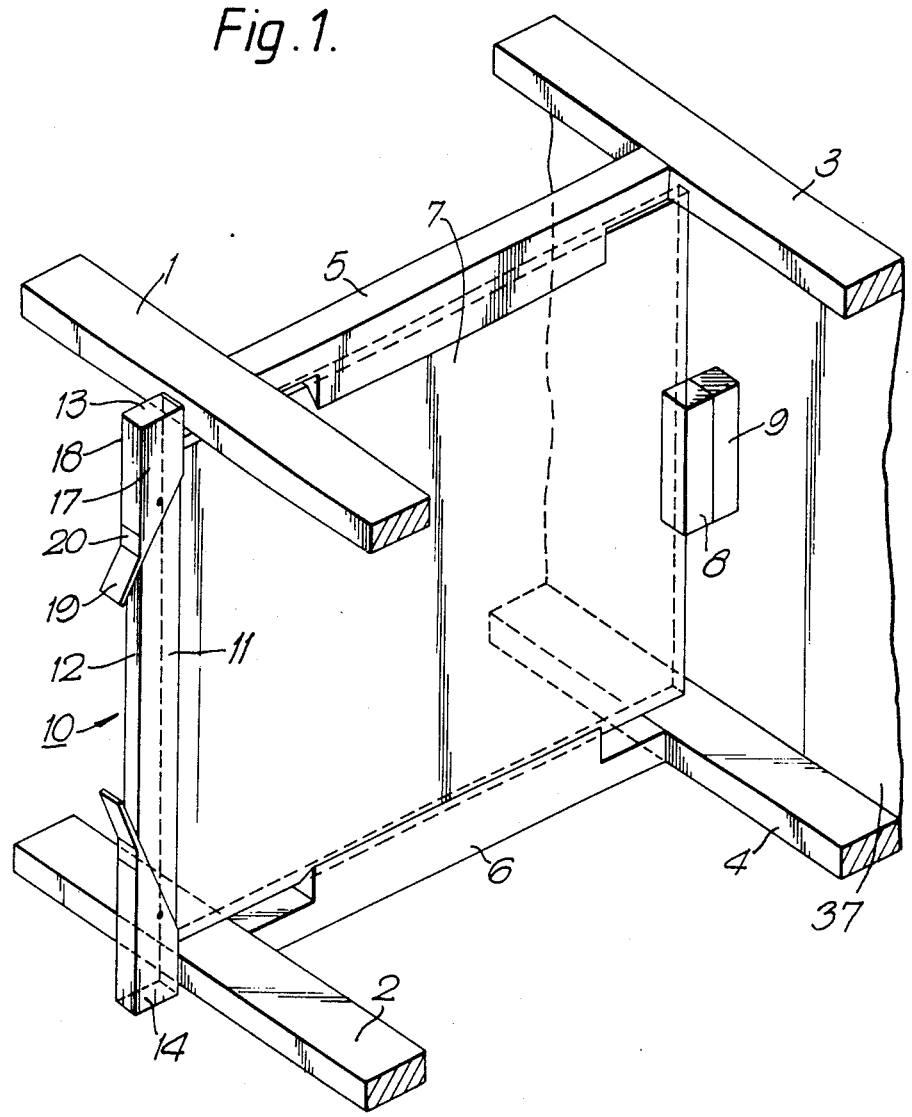

FIG. 1 is a schematic perspective view of a portion of a rack and a printed circuit board mounted therein. The shown portion of the rack comprises parallel front upper and lower cross-bar members 1 and 2 respectively and rear upper and lower cross-bar members 3 and 4 respectively. The cross-bar members are interconnected at their ends by further rack members (not shown). Two slotted guide means 5 and 6, depicted schematically, are respectively disposed between and supported by the upper pair of cross-bar members 1 and 3 and the lower pair of cross-bar members 2 and 4. The guide means 5 and 6 support a printed circuit board 7 along its side edges and, when the board is inserted into the rack, guide a multi-pin plug 8 mounted at the rear end of the board into engagement with a corresponding socket 9 mounted on a so-called "mother board" 37 which may be connected to the rear cross-bar members 3 and 4.

Figure 2:
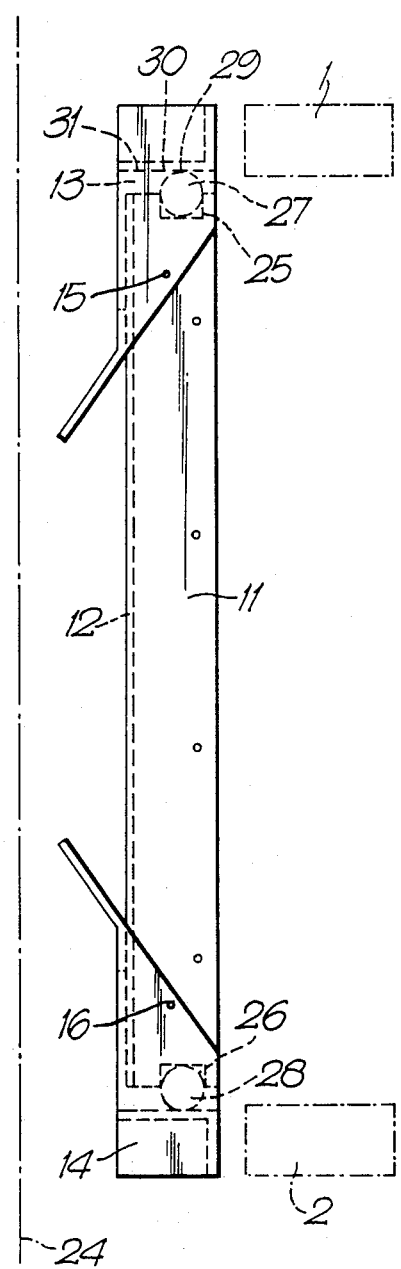
FIG. 2 is a side view, on a larger scale than FIG. 1, of the handle.
Figure 3:
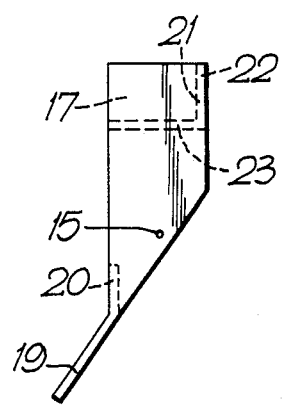
FIG. 3 shows separately, in side view, an ejector lever of the handle.

For manually inserting and removing the board 7 into and from the rack, a handle 10 made in accordance with the invention is attached to the front end of the board. FIG. 2 is an enlarged side view of the handle. It comprises a rigid elongate member 11 which is secured, for example by bolt, to the printed circuit board close to the front edge thereof. The front face of the member 11 normal to the plane of the board is formed with a board slot 12 for receiving a strip of card or the like bearing an identifying legend for the particular board. Two identical ejector levers 13 and 14 are pivotably attached to the member 11, one at each end thereof, by respective pivots 15 and 16. One of the levers is shown separately in the side view of FIG. 3. It comprises (see also FIG. 1) two flat spaced parallel wings 17 and 18, a manual grip 19, and, extending between the wings 17 and 18, a first web 20 contiguous with the grip 19 and a right-angled second web 21. The orthogonal parts of the web 21 will for convenience be referred to by their disposition as drawn, i.e. a vertical web part 22 and a horizontal web part 23.

When the lever is in its inoperative condition, it lies with the first web 20 in contact with the narrow vertical front face of the member 11 that includes the slot 12. The vertical part 22 of the second web is then spaced from the adjacent cross-bar 1 or 2 respectively. To withdraw the board from the rack, the levers are manually rotated by means of their grips 19 so that their respective vertical parts 22 press against the cross-bar members 1 and 2, each exerting a moment on the elongate member 11 that tends to withdraw the board from the rack.

As explained above, if the levers are not subject to restraint, the play in the levers can, when the rack is for example subjected to vibration, result in rattle as the levers vibrate between their inoperative and operative positions. Furthermore, if the rack comprising cross-bar members 1-4 can itself be slid in the longitudinal direction of the cross-bar members, for example into and out of a housing, then if a member of the housing is disposed fairly close to the handle 10 (in a position indicated by the dash-dot line 24 in FIG. 2), rotation of a lever away from its inoperative position can result in the grip 19 engaging the housing member and interfering with the sliding of the rack.

To alleviate this problem, the elongate member 11 is provided with two recesses 25, 26 respectively adjacent the levers 13, 14; the recesses receive respective resiliently deformable elements 27, 28 which engage, and are trapped in their recesses by, the horizontal web part 23 of the respective lever. Since the horizontal web part 23 is substantially planar, its radial distance from the pivot of the lever varies along the part. As depicted in FIG. 2, the surface of the horizontal web part 23 that faces the pivot has a plurality of portions 29-31 which are successively respectively engageable with the element 27 as the lever is rotated. Portion 30 which lies in the region of the normal to the horizontal flange part 23 from the pivot 15 is closer to the pivot than portions 29 and 31 lying on opposite sides of portion 30. Thus the resiliently deformable element 27 is subject to greater deformation when it is in engagement with portion 30 than when it is in engagement with portion 29 or portion 31. Consequently, when the element 27 is in engagement with the surface of horizontal web part 23 to the right of portion 30, it will urge the lever towards its inoperative position. Analogously, when the element 27 is in engagement with the surface of the portion 31 to the left of portion 30, it will urge the lever towards its operative position. This can be useful for gaining uninterrupted access to the slot 12 for inserting or removing an identifying card; access is normally blocked by the horizontal web part 23 when the lever is in its operative position.

Suitably, the resilient deformable elements 27, 28 are cylindrical elements of neoprene rubber, to which some silicone grease may be applied to facilitate sliding of the surface of horizontal web part 23 over the circumferential surface of the deformable element.

As an alternative to the arrangement described with reference to the drawings, the recesses may be provided in the levers rather than in the main elongate member of the handle. Such an arrangement however may be more complex to design and, in particular, to manufacture; for example, a sharply curved surface (rather than a planar surface) could be used to co-operate with the resiliently deformable element.

As a further alternative to the described arrangement, the resiliently deformable element received in a recess in, for example, the elongate member, need not directly engage the lever but may co-operate with it via at least one intermediate element, such as a plunger also received in the recess. This however has the disadvantage of rather greater complexity.

I claim:

1. A handling device suitable for manually inserting and removing a printed circuit board into and from a rack, said device comprising a rigid elongate member adapted to be attached to a printed circuit board at one end thereof substantially in the plane of the board, and further comprising two ejector levers pivotably attached to the elongate member respectively, one at each end thereof, each lever being manually rotatable in the plane of the board about a respective pivot from an inoperative position to an operative position in which, when the board is mounted in the rack and the levers are pivoted from their inoperative positions to their operative positions, each lever engages the rack for exerting a moment on the device tending to withdraw the board from the rack, wherein the device comprises two resiliently deformable elements each adapted to urge a respective one of the levers towards said inoperative position, in which position neither lever engages said rack.

2. A handling device as claimed in claim 1, wherein recesses are provided in the elongate member respectively adjacent the levers, each deformable element being received in an associated recess and being cooperable with a respective adjacent lever to urge the lever towards said inoperative position.

3. A handling device as claimed in claim 2, wherein each lever has a surface with a plurality of portions successively respectively engageable with its respective deformable element as the lever is rotated, said plurality comprising first and second portions which are respectively relatively further from and closer to the pivot of the lever and which are so disposed that when the deformable element engages the first portion, it urges the lever towards said inoperative position.

4. A handling device as claimed in claim 3, wherein each deformable element is a cylindrical element of resiliently deformable material, the cylindrical surface of each element engaging an associated surface of its respective lever.

5. A handling device as claimed in claim 3, wherein said plurality of portions comprises a third portion which is further from the pivot than the second portion and which is on the side of the second portion remote from the first portion, whereby when the deformable element engages the third portion, it urges the lever towards said operative position.

6. A handling device as claimed in claim 5, wherein each deformable element is a cylindrical element of resiliently deformable material, the cylindrical surface of each element engaging an associated surface of its respective lever.

7. A printed circuit board in combination with a handling device as claimed in any one of claims 1 to 4.

8. A rack for printed circuit boards, in combination with one or more of the combinations of a printed circuit board and a handling device as claimed in claim 6.

* * * * *